United States Patent
Sotnikov et al.

(10) Patent No.: US 9,916,412 B2
(45) Date of Patent: Mar. 13, 2018

(54) AUTOMATIC GENERATION OF TEST LAYOUTS FOR TESTING A DESIGN RULE CHECKING TOOL

(71) Applicants: Mikhail Anatolievich Sotnikov, Moscow (RU); Alexander Leonidovich Kerre, Solnechnogorsk (RU)

(72) Inventors: Mikhail Anatolievich Sotnikov, Moscow (RU); Alexander Leonidovich Kerre, Solnechnogorsk (RU)

(73) Assignee: NXP USA, Inc., Austin, TX (US)

( * ) Notice: Subject to any disclaimer, the term of this patent is extended or adjusted under 35 U.S.C. 154(b) by 40 days.

(21) Appl. No.: 14/779,351

(22) PCT Filed: Apr. 1, 2013

(86) PCT No.: PCT/RU2013/000272
§ 371 (c)(1),
(2) Date: Sep. 23, 2015

(87) PCT Pub. No.: WO2014/163519
PCT Pub. Date: Oct. 9, 2014

(65) Prior Publication Data
US 2016/0048629 A1 Feb. 18, 2016

(51) Int. Cl.
*G06F 17/50* (2006.01)
*G06F 11/36* (2006.01)

(52) U.S. Cl.
CPC ...... *G06F 17/5081* (2013.01); *G06F 11/3684* (2013.01); *G06F 17/5072* (2013.01)

(58) Field of Classification Search
CPC ............. G06F 17/5081; G06F 11/3684; G06F 17/5072

USPC .................................................. 716/106–107
See application file for complete search history.

(56) References Cited

U.S. PATENT DOCUMENTS

| | | |
|---|---|---|
| 5,590,049 A | 12/1996 | Arora |
| 5,892,947 A | 4/1999 | Delong et al. |
| 6,606,735 B1 * | 8/2003 | Richardson ......... G06F 17/5081 716/112 |
| 6,732,338 B2 | 5/2004 | Crouse et al. |
| 7,254,791 B1 | 8/2007 | Agrawal et al. |
| 8,191,034 B1 * | 5/2012 | Mohan ................ G06F 17/5081 716/136 |

(Continued)

OTHER PUBLICATIONS

International Search Report and Written Opinion correlating to PCT/RU2013/000272 dated Dec. 25, 2013.

(Continued)

*Primary Examiner* — Stacy Whitmore

(57) ABSTRACT

A method of automatically generating a set of test layouts for testing a design rule checking tool is described. A layout is a point in a space of several coordinates, and the design rule comprises N design constraints numbered 1 to N, wherein N is greater or equal two and each design constraint is a boolean-valued function of one or more of the coordinates. The set of test layouts includes: one or more zero-error layouts; one or more one-error layouts; and one or more two-error layouts. A zero-error layout is a layout that satisfies all of the design constraints. A one-error layout is a layout that violates exactly one of the design constraints. A two-error layout is a layout that violates exactly two of the design constraints.

20 Claims, 1 Drawing Sheet

(56) References Cited

U.S. PATENT DOCUMENTS

| 8,584,075 B2* | 11/2013 | Datta | G06F 17/5036 |
|---|---|---|---|
| | | | 716/101 |
| 2005/0229044 A1 | 10/2005 | Ball | |
| 2011/0107286 A1 | 5/2011 | Batterywala et al. | |
| 2013/0185687 A1* | 7/2013 | Chung | G06F 17/5081 |
| | | | 716/111 |
| 2015/0161325 A1* | 6/2015 | Yang | G06F 17/5068 |
| | | | 716/112 |

OTHER PUBLICATIONS

Cho, Eric Y., "A Subjective Review of Compaction", 22nd Conference on Design Automation 1985, IEEE.

* cited by examiner

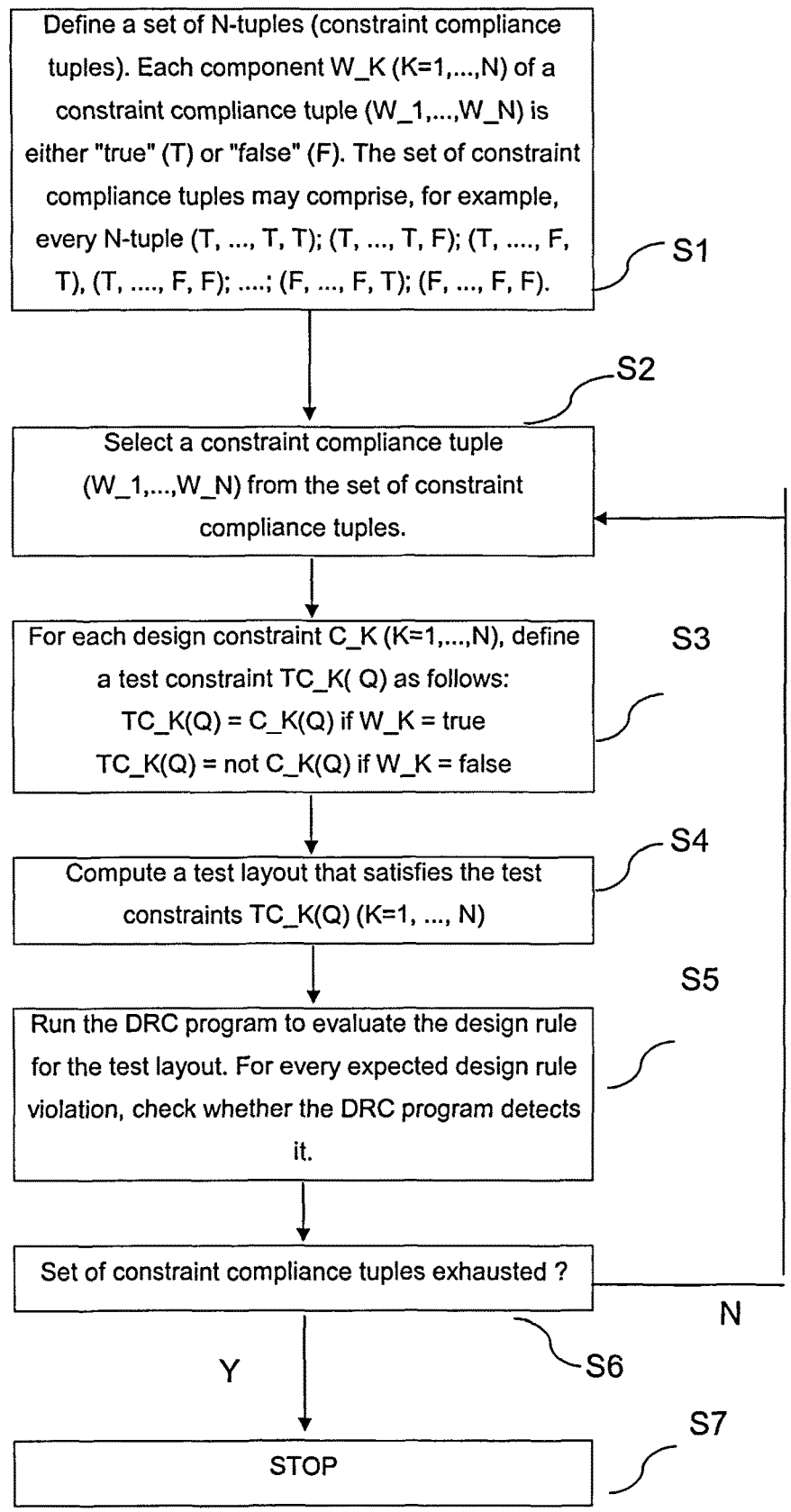

AUTOMATIC GENERATION OF TEST LAYOUTS FOR TESTING A DESIGN RULE CHECKING TOOL

FIELD OF THE INVENTION

This invention relates to an automatic generation of test layouts for testing a design rule checking tool.

BACKGROUND OF THE INVENTION

A design rule is a list of constraints that must be satisfied by a technical device such as an integrated circuit. For example, conductors in a circuit may be required to be separated from each other by a certain minimum distance. There also may be constraints concerning the size and the shape of circuitry. A design rule can be rather complex, firstly because of the number of parameters involved and secondly due to the fact that a certain requirement such as the minimum distance between two conductors may depend on parameters such as the thickness of these conductors or their curvature. A design rule checking (DRC) tool therefore needs to be tested before it is used to make sure that the DRC tool, when applied to a given design, will detect any violation of a design rule. Missed violations of design rules often lead to silicon failure. Attempts have therefore been made to devise reliable methods for the testing of design rule checking tools.

A DRC tool may be tested using a large number of test layouts (test cases) that comprise test cases in accordance with the design rule to be tested as well as cases violating the design rule. For a design rule that comprises N different design constraints, for example, one test case per design constraint may be created so that each test case violates exactly one design constraint of the design rule. The present disclosure was motivated by the realization that such a set of test cases may be incomplete.

SUMMARY OF THE INVENTION

The present invention provides a method of automatically generating of test layouts for testing a design rule as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 shows a flow chart of an example of a method of automatically generating a set of test layouts.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The flow chart in FIG. 1 illustrates an example of a method of testing a design rule checking program. More specifically, the flow chart relates to testing the DRC program in view of a specific design rule implemented in the DRC program. The design rule may comprise N different design constraints C1 to CN which may be numbered 1 to N. The constant N may be any natural number. However, the main interest of the present description arises when N is greater than equal or equal to 2. Each design constraint CK may be defined as a Boolean valued function of one or more coordinates Q1 to QM (M≥1). The definition of the coordinates, i.e. their number M and their geometrical meaning, may be used as input data in the method described herein. The definition of the constraints, i.e. their number N and the meaning of each constraint, may, in turn, depend on the definition of the coordinates.

The coordinates Q1 to QM may be any kinds of coordinates for describing a layout such as an electronic circuit, a microchip, or portions thereof. The coordinates Q1 to QM may, for example, describe positions of individual components of the layout, their orientations, their sizes, their shapes, and any other kinds of geometrical characteristics. The coordinates Q1 to QM may include distance coordinates as well as angular coordinates as well as other kinds of coordinates. Each coordinate QK may be a real valued number. Each design constraint CK may be false for certain values of the coordinate Q1 to QM and true for the remaining values of the coordinates Q1 to QM. The space of coordinates Q1 to QM may thus comprise regions in which the respective constraint is satisfied (CK=true) and regions in which the design constrain is violated (CK=false). A layout may be identified with a certain point in the space of the coordinates Q1 to QM.

For instance, in an example in which the coordinates Q1 and Q2 specify the X positions X1 and X2 of two parallel conductors extending in the Y direction, a first constraint C1 and a second constraint C2 may define a minimum required distance between the two conductors as follows:

Q1=true if X1−X2≥D12; Q1=false otherwise;
Q2=true if X2−X1≥D12; Q2=false otherwise;

C1 and C2 may, for example, be associated disjunctively, i.e., by a logical "or" operator. In this example, the design rule may thus include the expression "C1 or C2".

More generally, the design rule may include "and" operators as well as "or" operators. The design rule may be expressed as a disjunctive normal form or, alternatively, as a conjunctive normal form. A disjunctive normal form comprises one or more subrules that are associated disjunctively, i.e., by "or" operators, each subrule including one or more constraints that are associated conjunctively, i.e., by "and" operators. A subrule in a disjunctive normal form of a design rule has also been referred to as a "solution" in the art.

It is noted that the method described herein in reference to a design rule may also be applied individually to each subrule of a design rule. It may be particularly beneficial to apply the proposed method individually to the subrules of a conjunctive normal form of a design rule. The design constraints C1 to CN referred to herein may in this case be the design constrains of the respective subrule.

The method illustrated in FIG. 1 may start with a first block S1 in which a set of N-tuples may be defined. These tuples are referred to herein as constraint compliance tuples or as abstract test cases. Each constraint compliance tuple may serve as an auxiliary multibit variable for constructing a specific test case. Each component WK (K=1 to N) of a constraint compliance tuple (W1 ... WN) may be either true (T) or false (F) and may thus specify whether the test layout to be generated is to satisfy or to violate a particular design constraint in the design rule. For example, the constraint compliance tuple (T, ..., T) that is the tuple of only true components may be identified with a test layout that satisfies all the constraints C1 to CN whereas the constraint compliance tuple (F ... F, F) may be identified with a test layout that violates each of the constraints C1 to CN. The set of constraint compliance tuples defined in block S1 may notably comprise at least one constraint compliance tuple that has two false components. A corresponding set of test layouts that violate exactly two of the constraints may thus be constructed. This may result in a more reliable design rule test when compared to a design rule test that does not involve any two-error layouts. A two-error layout is a layout that violates exactly two constraints of the design rule. More generally, a P error layout is a layout that violates P constraints of the design rule and satisfies the others. A P error constraint compliance tuple may be defined analogously as a constraint compliance tuple that has P false components and N-P true components.

Each test layout may either be a pass test case or a fail test case. A pass test case is a layout that satisfies the design rule. A fail test case is a test case that does not satisfy the design rule.

For example, the design rule may be a disjunction, that is an "or" association, of subrules. Each subrule may be a conjunction, that is, an "and" association, of constraints. In this case, a pass test case is a layout that satisfies at least one subrule, whereas a fail test case is a layout that violates every subrule. The DRC tool to be tested should not report errors on a pass test case but report at least one error on a fail test case.

The set of constraint compliance tuples may comprise, in addition to the mentioned two-error tuples, other constraint compliance tuples. The set of constraint compliance tuples may notably comprise the zero-error tuple (T, ..., T, T) and one or more one-error constraint compliance tuples.

The set of constraint compliance tuples may notably comprise every possibly two-error constraint compliance tuple. A complete set of two-error layouts may thus be generated. The set of two-error layouts may, for example, be complete in the sense that the the tuple formed of the design constraint values (C1(Qtest), ..., C_N(Qtest)) assumes every possible two-error value ((T, ..., T, F, F); ...; (F, F, T, ..., T)) when evaluated for every test layout (Qtest) in the set of test layouts.

In block S2, a particular constraint compliance tuple (W1 ... WN) may be selected from the set of constraint compliance tuples in order to construct a particular test case.

For each design constraint CK (K=1 to N), a test constraint TCK may then be defined as follows:

TC_K(Q)=C_K(Q) if W_K=true
TC_K(Q)=not C_K(Q) if W_K=false.

The test constraints TCK may be input to a constraint solving algorithm, e.g., a graph-based algorithm, to construct a test layout that satisfies the test constraints TC_1 to TC_N. The test layout thus satisfies those design constraints that are indicated as "T" in the selected constraint compliance tuple (W1 ... WN) of block S2, and it violates the other design constraints, namely those marked as "F" in the selected constraint compliance tuple.

In block S5, the design constraints C1 to CN may be implemented in the design rule checking program. The DRC program may then be applied to the test layout generated in block S4. In other words, the DRC program may be run to check whether the test layout satisfies the design rule comprising the design constraints C1 to CN. As mentioned above, it may be particularly beneficial to consider an individual subrule, e.g., a solutions, as the design rule, in which case the design constraints C1 to CN may all be associated conjunctively, i.e., by "and" operators only. In this case, each of the constraints C1 to CN must be satisfied to satisfy the design rule, and if one or more than one of the components WK of the selected constraint compliance tuple is false, the DRC program should flag a design rule violation.

If the set of constraint compliance tuples contains a tuple that has not been selected before, the process may return to block S2, and a new constraint compliance tuple may be selected (blocks S6, S2). Otherwise, the process may stop (block S7).

In the example of FIG. 1, the process of generating the test layouts (blocks S1 to S4) is interleaved with the process of testing the DRC program (block S5). In another example, these processes may be performed one after the other. For example, it may be convenient to generate first a collection of test layouts and then apply the DRC program to each test layout. In this case, block S5 in FIG. 1 may be absent, and a block similar to block S5 may be arranged between blocks S6 and S7. In yet another variant, the method does not include block S5 or any similar block.

It should be noted that in some cases two or more of the test constraints for generating a test case may be contradictory. In this case, there is no point (layout) in the coordinate space that conforms to each of the design constraints CK (K=1 to N). If such a situation is detected subsequent to block S3, blocks S4 and S5 may be omitted, and the process may continue in block S6.

The invention may be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on transitory or non-transitory computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method comprising:
automatically generating, by a processing unit, a set of test layouts for testing a design rule checking tool, wherein a layout is within a space of several coordinates, and the design rule comprises N design constraints numbered 1 to N, wherein N is greater or equal two and each design constraint is a boolean-valued function of one or more of the coordinates, and wherein the set of test layouts includes:
one or more zero-error layouts;
one or more one-error layouts; and
one or more two-error layouts;
wherein a zero-error layout is a layout that satisfies all of the design constraints, a one-error layout is a layout that violates exactly one of the design constraints, and a two-error layout is a layout that violates exactly two of the design constraints;
testing, by the processing unit, the design rule checking tool to determine a number of zero-error layouts, a number of one-error layouts, and a number of two-error layouts;
generating a layout based on results of testing the design rule checking tool; and
manufacturing an integrated circuit based on the layout.

2. The method of claim 1, wherein generating the set of test layouts comprises:
defining a set of constraint compliance tuples, each constraint compliance tuple having N components each of which is either "true" or "false"; the set of constraint compliance tuples comprising the tuple of only "true" components, one or more tuples with precisely one "false" component, and one or more tuples with precisely two "false" components;
and, for each constraint compliance tuple from the set of constraint compliance tuples:
defining N test constraints numbered 1 to N, wherein the K-th test constraint is the K-th design constraint if the K-th component of the constraint compliance tuple is "true" and wherein the K-th test constraint is contrary to the K-th design constraint if the K-th component of the constraint compliance tuple of the test layout is "false"; and,
unless the N test constraints are contradictory, computing a test layout so as to satisfy the N test constraints.

3. The method of claim 2, wherein the set of constraint compliance tuples comprises 2**N different constraint compliance tuples.

4. The method of claim 2, wherein computing said test layout comprises: declaring the N test constraints as constraints in a constraint graph program; and running the constraint graph program to determine the test layout.

5. The method of claim 1, comprising for each test layout: dividing the set of design constraints into a first subset and a second subset; and using a constraint graph algorithm to compute the test layout so as to satisfy every design constraint of the first subset and to violate every design constraint of the second subset.

6. The method of claim 1, wherein a tuple formed of the design constraint values assumes every possible two-error value, when evaluated for every test layout in the set of test layouts.

7. The method of claim 1, wherein a tuple formed of the design constraint values assumes every possible one-error value when evaluated for every test layout in the set of test layouts.

8. The method of claim 1, wherein a tuple formed of the design constraint values assumes every possible value when evaluated for every test layout in the set of test layouts.

9. The method of claim 1, wherein each of the design constraints involves an equality or inequality between one of the coordinates and a constant, or between two of the coordinates, the design constraint having the value "true" if the coordinate conforms to the equality or inequality and "false" if the coordinate violates the equality or inequality.

10. The method of claim 1, wherein the design constraints are conjunctively associated to form the design rule.

11. A method comprising:
decomposing, by a processing unit, a complex design rule into two or more disjunctively associated simple design rules; each simple design rule composed of one or more conjunctively associated constraints; and for each of the simple design rules:
automatically generating a set of test layouts for testing a design rule checking tool, wherein a layout is within a space of several coordinates, and the design rule comprises N design constraints numbered 1 to N, wherein N is greater or equal two and each design constraint is a boolean-valued function of one or more of the coordinates, and wherein the set of test layouts includes:
one or more zero-error layouts;
one or more one-error layouts; and
one or more two-error layouts;
wherein a zero-error layout is a layout that satisfies all of the design constraints, a one-error layout is a layout that violates exactly one of the design constraints, and a two-error layout is a layout that violates exactly two of the design constraints; and
testing, by the processing unit, the design rule checking tool to determine a number of zero-error layouts, a number of one-error layouts, and a number of two-error layouts; and
generating a layout based on results of testing the design rule checking tool; and
manufacturing an integrated circuit based on the layout.

12. The method of claim 11, wherein generating the set of test layouts comprises:
defining a set of constraint compliance tuples, each constraint compliance tuple having N components each of which is either "true" or "false"; the set of constraint compliance tuples comprising the tuple of only "true" components, one or more tuples with precisely one "false" component, and one or more tuples with precisely two "false" components;
and, for each constraint compliance tuple from the set of constraint compliance tuples:
defining N test constraints numbered 1 to N, wherein the K-th test constraint is the K-th design constraint if the K-th component of the constraint compliance tuple is "true" and wherein the K-th test constraint is contrary to the K-th design constraint if the K-th component of the constraint compliance tuple of the test layout is "false"; and,
unless the N test constraints are contradictory, computing a test layout so as to satisfy the N test constraints.

13. The method of claim 12, wherein the set of constraint compliance tuples comprises 2**N different constraint compliance tuples.

14. The method of claim 12, wherein computing said test layout comprises: declaring the N test constraints as constraints in a constraint graph program; and running the constraint graph program to determine the test layout.

15. The method of claim 11, comprising for each test layout: dividing the set of design constraints into a first subset and a second subset; and using a constraint graph algorithm to compute the test layout so as to satisfy every design constraint of the first subset and to violate every design constraint of the second subset.

16. The method of claim 11, wherein the tuple formed of the design constraint values assumes every possible two-error value, when evaluated for every test layout in the set of test layouts.

17. The method of claim 11, wherein the tuple formed of the design constraint values assumes every possible one-error value when evaluated for every test layout in the set of test layouts.

18. The method of claim 11, wherein the tuple formed of the design constraint values assumes every possible value when evaluated for every test layout in the set of test layouts.

19. The method of claim 11, wherein each of the design constraints involves an equality or inequality between one of the coordinates and a constant, or between two of the coordinates, the design constraint having the value "true" if the coordinate conforms to the equality or inequality and "false" if the coordinate violates the equality or inequality.

20. The method of claim 11, wherein the design constraints are conjunctively associated to form the design rule.

* * * * *